United States Patent
Abu-Surra et al.

(10) Patent No.: US 8,839,078 B2
(45) Date of Patent: Sep. 16, 2014

(54) APPLICATION LAYER FEC FRAMEWORK FOR WIGIG

(75) Inventors: Shadi Abu-Surra, Richardson, TX (US); Eran Pisek, Plano, TX (US); Farooq Khan, Allen, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 310 days.

(21) Appl. No.: 13/038,938

(22) Filed: Mar. 2, 2011

(65) Prior Publication Data

US 2011/0219279 A1 Sep. 8, 2011

Related U.S. Application Data

(60) Provisional application No. 61/311,133, filed on Mar. 5, 2010, provisional application No. 61/332,581, filed on May 7, 2010.

(51) Int. Cl.
*H03M 13/00* (2006.01)

(52) U.S. Cl.
USPC .......................................... 714/776; 714/758

(58) Field of Classification Search
USPC ................................................. 714/776, 758
See application file for complete search history.

(56) References Cited

U.S. PATENT DOCUMENTS

| | | | |
|---|---|---|---|
| 6,934,305 B1 * | 8/2005 | Duschatko et al. | 370/514 |
| 2005/0169205 A1 * | 8/2005 | Grilli et al. | 370/313 |
| 2006/0075321 A1 * | 4/2006 | Vedantham et al. | 714/776 |
| 2006/0150055 A1 | 7/2006 | Quinard et al. | |
| 2009/0164836 A1 * | 6/2009 | Carmichael | 714/6 |
| 2009/0198885 A1 * | 8/2009 | Manoj | 711/114 |
| 2009/0276686 A1 * | 11/2009 | Liu et al. | 714/776 |
| 2009/0327842 A1 * | 12/2009 | Liu et al. | 714/776 |
| 2010/0058147 A1 * | 3/2010 | Seferoglu et al. | 714/776 |
| 2010/0223533 A1 * | 9/2010 | Stockhammer et al. | 714/776 |
| 2010/0263007 A1 * | 10/2010 | Zhang et al. | 725/110 |

OTHER PUBLICATIONS

International Search Report dated Oct. 26, 2011 in connection with International Patent Application No. PCT/KR2011/001543.
Written Opinion of the International Searching Authority dated Oct. 26, 2011 in connection with International Patent Application No. PCT/KR2011/001543.
D. Gomez-Barquero, et al.: "Application Layer FEC for Mobile TV Delivery in IP Datacast Over DVB-H Systems", IEEE Transactions on Broadcasting, vol. 55, Issue 2, Jun. 2009, 11 pages.
D. Gonzalvez, et al.: "AI-FEC for Improved Mobile Reception of MPEG-2 DVB-T Transport Streams", International Journal of Digital Multimedia Broadcasting, 2009, see Chapter 3, 10 pages.
Australian Examination dated Aug. 6, 2013 in connection with Australian Patent Application 2011221689; 3 pages.

* cited by examiner

*Primary Examiner* — M. Mujtaba K Chaudry

(57) ABSTRACT

A method and apparatus perform forward error correction in a wireless communication device in a wireless communication network. Application layer forward error correction (AL-FEC) capability information is transmitted during a capabilities exchange. A set of source packets are reshaped to k equal-sized source symbols. Systematic packets for the source symbols and at least one parity packet is encoded using a single parity check (SPC) AL-FEC code on the k source symbols. A header of each encoded packet includes a parity packet indicator. The encoded packets are processed in a media access control (MAC) layer and a physical (PHY) layer for transmission.

14 Claims, 10 Drawing Sheets

AL-FEC ENCODING

AL-FEC DECODING

Non-Interleaved Single Parity Check

Parity
Packet

| 0 | = | 1 | + | 2 | + ... + | 24 | k (over 1..24), n (over 0..24)

FIGURE 5A

Interleaved Single Parity Check

| 0 | = | 4 | + | 8 | + ... + | 96 |
| 1 | = | 5 | + | 9 | + ... + | 97 |
| 2 | = | 6 | + | 10 | + ... + | 98 |
| 3 | = | 7 | + | 11 | + ... + | 99 |

| PacketType | StreamID | SeqNum | Length | Other Headers | Payload |
|---|---|---|---|---|---|
| 1 | 1 | 2 | 2 | Variable | Variable |

FIGURE 7

APPLICATION LAYER FEC FRAMEWORK FOR WIGIG

CROSS-REFERENCE TO RELATED APPLICATION(S) AND CLAIM OF PRIORITY

The present application is related to U.S. Provisional Patent Application No. 61/311,133, filed Mar. 5, 2010, entitled "APPLICATION LAYER FEC FRAMEWORK FOR WiGig". Provisional Patent Application No. 61/311,133 is assigned to the assignee of the present application and is hereby incorporated by reference into the present application as if fully set forth herein. The present application is related to U.S. Provisional Patent Application No. 61/332,581, filed May 7, 2010, entitled "APPLICATION LAYER FEC FRAMEWORK FOR WiGig". Provisional Patent Application No. 61/332,581 is assigned to the assignee of the present application and is hereby incorporated by reference into the present application as if fully set forth herein. The present application hereby claims priority under 35 U.S.C. §119(e) to U.S. Provisional Patent Application Nos. 61/311,133 and 61/332,581.

TECHNICAL FIELD OF THE INVENTION

The present application relates generally to a reliable data transmission over wireless connections and, more specifically, to a method and an apparatus for implementing a forward error correction (FEC) framework at the application layer for communication over a Wireless Gigabit Alliance (WiGig) link.

BACKGROUND OF THE INVENTION

The great demand for a reliable multimedia transmission over wireless connections present vast challenges to engineers. Usually, video media requires high transmission rate with delay constraints. Moreover, the media is transmitted over a broadcast channel such as in streaming TV channels, or over a multicast channel such as in transferring videos that are encapsulated in a large file for numerous users. The nature of these channels, in addition to the delay constraints, excludes the option of having a feedback channel to acknowledge the transmission success. Consequently, in such scenarios, an alternative technique is required to guarantee the reliability of transmission.

The Wireless Gigabit Alliance specification (WiGig) is directed to a multi-gigabit speed wireless communications technology. As such, WiGig enables high performance wireless data, display, and audio applications that supplement the capabilities of today's wireless LAN (local area network) devices. The technical specifications of WiGig are disclosed in TWG-2010-0574-00-WGA-D08: "WiGig WGA specifications" and are hereby incorporated by reference.

However, the WiGig specification does not allow the use of an automatic repeat request (ARQ) scheme during the broadcast\Multicast transmission. Moreover, in time sensitive applications (e.g. multimedia, gaming, and so forth), ARQ is not the most efficient error control scheme, especially when the channel suffers long outages and high packet loss rate caused by blockage and a relatively slow beamforming algorithm. In the absence of the ARQ feedback, the physical layer forward error correcting (PHY FEC) codes cannot provide enough protection to achieve low packet loss rate (approximately $10^{-5}$). As such, it is necessary to have a second FEC scheme to reduce the packet loss rate.

SUMMARY OF THE INVENTION

In an embodiment, a method for performing forward error correction in a wireless communication device in a wireless communication network is provided. The method includes transmitting application layer forward error correction (AL-FEC) capability information during a capabilities exchange. A set of source packets are reshaped to k equal-sized source symbols. Systematic packets for the source symbols and at least one parity packet is encoded using a single parity check (SPC) AL-FEC code on the k source symbols. A header of each encoded packet includes a parity packet indicator. The encoded packets are processed in a media access control (MAC) layer and a physical (PHY) layer for transmission.

In another embodiment, an apparatus for performing forward error correction (FEC) in a wireless communication device in a wireless communication network is provided. The apparatus includes a transmitter and a controller coupled to the transmitter. The transmitter communicates with other communication devices. The controller transmits application layer forward error correction (AL-FEC) capability information during a capabilities exchange, reshapes a set of source packets to k equal-sized source symbols, encodes systematic packets for the source symbols and at least one parity packet using a single parity check (SPC) AL-FEC code on the k source symbols, a header of each encoded packet comprising a parity packet indicator, and processes the encoded packets in a media access control (MAC) layer and a physical (PHY) layer for transmission.

In yet another embodiment, a method of performing forward error correction (FEC) in a wireless communication device in a wireless communication network is provided. The method includes transmitting application layer forward error correction (AL-FEC) capability information during a capabilities exchange. A set of source packets is reshaped to form a set of equal-sized source symbols. Systematic packets and at least one repair packet are encoded using an AL-FEC code on the source symbols, a header of each encoded packet comprising a parity packet indicator. And the encoded packets are processed in a media access control (MAC) layer and a physical (PHY) layer for transmission.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 5A illustrates an example of a non-interleaved single parity check scheme according to an embodiment of the present invention;

FIG. 5B illustrates an example of an interleaved single parity check scheme according to an embodiment of the present invention;

FIG. 7 illustrates a description of a header of a packet that has been encoded using an AL-FEC scheme according to an embodiment of the present disclosure;

DETAILED DESCRIPTION OF THE INVENTION

FIGS. 1 through 10, discussed below, and the various embodiments used to describe the principles of the present disclosure in this patent document are by way of illustration only and should not be construed in any way to limit the scope of the disclosure. Although the embodiments described may refer to devices that support WiGig, those skilled in the art will understand that the principles of the present disclosure may be implemented in any suitably arranged wireless communication system.

Figure 1:
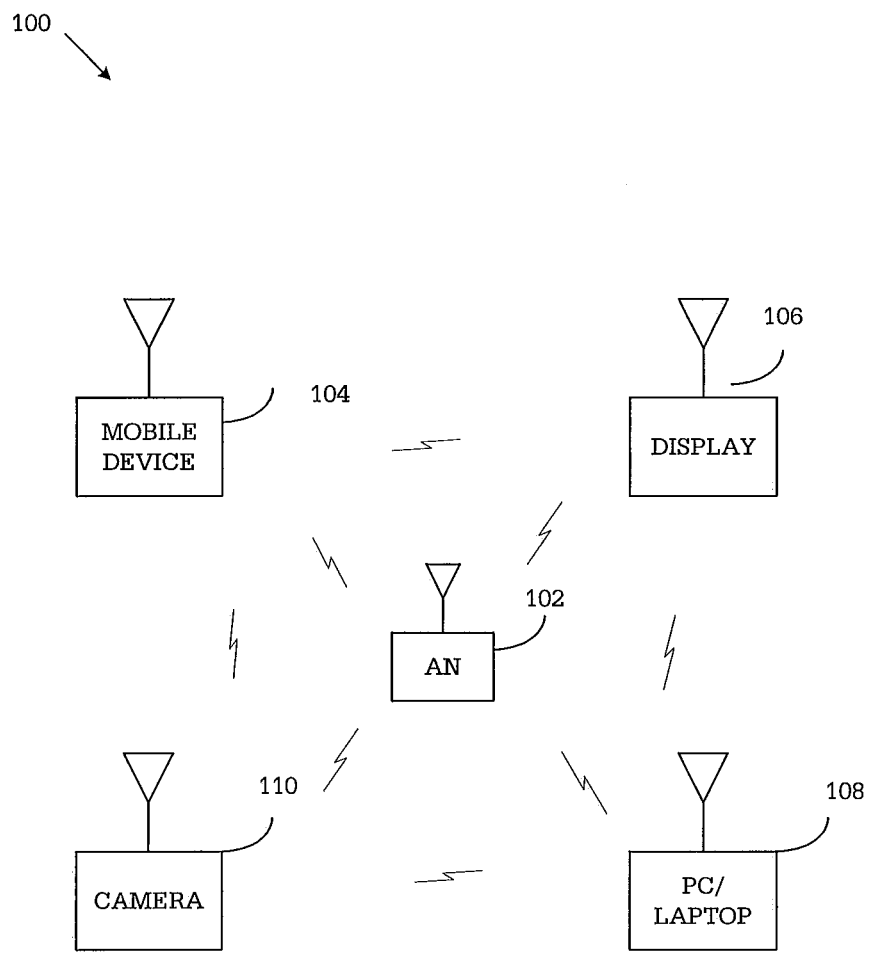
FIG. 1 illustrates a wireless network 100 that supports WiGig, according to the principles of the present disclosure.

FIG. 1 illustrates a wireless network 100 that supports WiGig, according to the principles of the present disclosure. In the illustrated embodiment, wireless network 100 includes an access node (AN) 102, mobile device 104, display device 106, a personal computer (PC) 108, and a camera 110. AN 102 may be a router, base station, cable box, or any device that receives a data service. Mobile device 104 may be any portable device such as a cell phone, personal digital assistant (PDA), tablet device, electronic reader, and so forth. Display 106 may be any output device such as a projector, television, computer display, a stereo receiver, and so forth. Camera 110 represents any peripheral device such as a printer, camcorder, webcam, scanning device, medical imaging apparatus, and so forth. Assuming all of the devices 102-110 support WiGig, each of the devices 102-110 may form a WiGig connection with one or more of the other devices. For example, PC 108 may transmit audio/video (A/V) data to display 106, receive data from camera (or peripheral device) 110, perform a sync operation with mobile device 104, and connect to the Internet through AN 102.

Figure 2A:
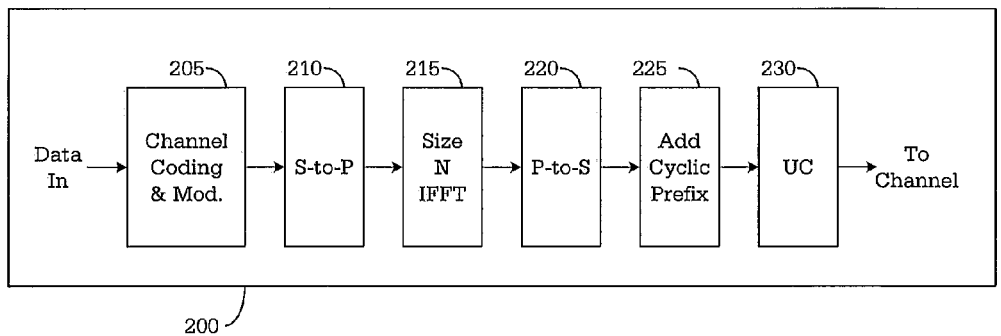
FIG. 2A illustrates a high-level diagram of an orthogonal frequency division multiple access transmit path according to an embodiment of the present disclosure.
Figure 2B:
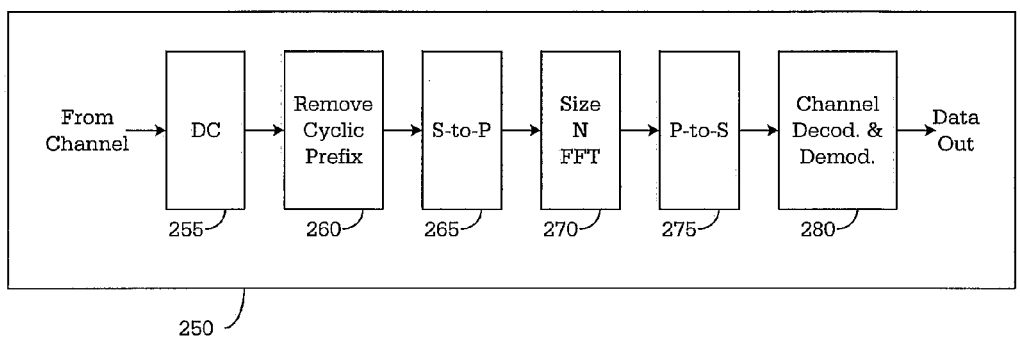
FIG. 2B illustrates a high-level diagram of an orthogonal frequency division multiple access receive path according to an embodiment of the present disclosure.

FIG. 2A is a high-level diagram of an orthogonal frequency division multiplexing (OFDM) transmit path. FIG. 2B is a high-level diagram of an OFDM receive path. In FIGS. 2A and 2B, the OFDMA transmit path 200 and the OFDMA receive path 250 are implemented in a transmitter and receiver of a wireless communication device, respectively. In some embodiments the elements of the transmit path 200 and the receive path 250 may be combined in a single transceiver.

The transmit path 200 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path of receiver 250 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation. In addition, a wireless communication device may include one or more controllers configured to implement the paths in FIGS. 2A and 2B.

Furthermore, although this disclosure is directed to an embodiment that implements the Fast Fourier Transform and the Inverse Fast Fourier Transform, this is byway of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

Moreover, in other embodiments the transmit path and the receive path may employ other types of modulation and coding schemes that share common elements (such as preamble and channel. For example, one embodiment may support single carrier, which typically results in lower power consumption for small, low-power handheld devices.

In the transmit path 200, channel coding and modulation block 205 receives a set of information bits, applies coding (e.g., LDPC coding) and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in the wireless communication devices. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at the receive path 250 of a receiving device after passing through the wireless channel. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Transferring audio and video are important applications of WiGig. However, for good video quality, packet loss rate should be less than $10^{-5}$. In time sensitive applications (e.g. multimedia, gaming, and such), delay-constraints limit the performance of the system. In time sensitive applications, the dynamic buffer needed for retransmission adds significant complexity to implementation. And as mentioned, the media access control (MAC) layer in WiGig does not allow acknowledgements (ACKs) for broadcast/multicast packets. As such, for applications that can tolerate few losses, a simple scheme with a fixed buffer, no retransmission, and a packet loss rate of less than $10^{-5}$ is desirable.

Forward error control (FEC) schemes are suitable candidates in these scenarios. As a matter of fact FEC is being used in communications over any channel. In WiGig 60 GHz communications, low-density parity-check (LDPC) codes FEC scheme is adopted to achieve reliable communication. The LDPC codes are part of the system's physical layer and have the coding rates: 1/2, 5/8, 3/4, and 13/16. These codes can achieve good level of protection on the bit level and usually attain a bit error rate (BER) as low as $10^{-6}$. However, the achievable packet loss rate using this FEC scheme is just about 0.01. Consequently, an outer FEC scheme may substantially reduce the packet loss rate to an acceptable level (approximately $10^{-5}$). In particular, application layer FEC (AL-FEC) codes are the most suitable candidates in terms of their dynamic rate, low-overhead, and implementation cost. In the present disclosure, AL-FEC may refer to FEC performed in any functional layer above the media access control (MAC) layer.

Figure 3:
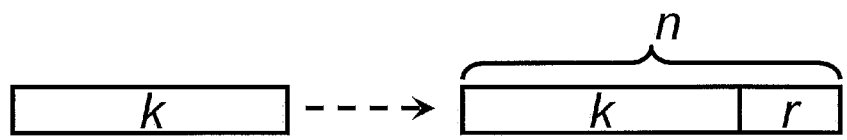
FIG. 3 illustrates the AL-FEC coding concept, according to an embodiment of the present disclosure.
Figure 3:
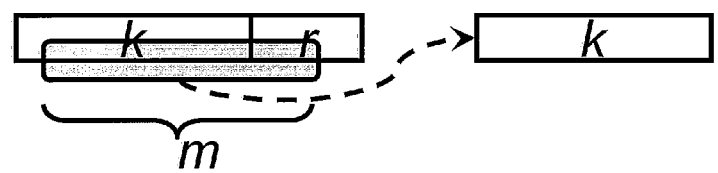

FIG. 3 illustrates the AL-FEC coding concept, according to an embodiment of the present disclosure. A transmitter performs AL-FEC encoding on k source symbols to generate a block of n symbols to be transmitted. The n symbols include the k source symbols and r repair symbols that were generated through the AL-FEC encoding operation. Once the n symbols are transmitted, a receiver receives any m of n symbols, where m is approximately equal to k. Them received symbols are decoded to recover missing symbols. The overhead is m−k≥0, and the number of generated symbols is calculated by Equation 1, below:

$$n=m/(1-\text{symbol loss rate}) \quad [\text{Eqn. 1}]$$

As such, there is small overhead as the system is operating so close to the symbol erasure channel capacity.

AL-FEC codes, ideally, are codes with the following properties:

1) Rateless codes: can generate an infinite number of encoded symbols (a symbol is usually a packet) from the original data.

2) Introduce no overhead: the receiver can reconstruct message that includes k symbols once any k encoded symbols have been received.

3) Simple: encoding/decoding should be very fast, preferably linear in time.

Approximate realizations of such codes are Matrix codes, Reed-Solomon codes, Luby transform (LT) codes, and raptor codes. The raptor codes may be the best overall approximation of AL-FEC codes.

Embodiments of an AL-FEC framework provide packet-level protection to the arbitrary flows (e.g. audio, compressed video, uncompressed video, and such) of the protocol adaptation layer (PAL) in WiGig. The AL-FEC framework may work with any FEC code (erasure code), but assumes the erasure code is systematic. In an embodiment, the AL-FEC framework is configured to support raptor code.

Figure 4:
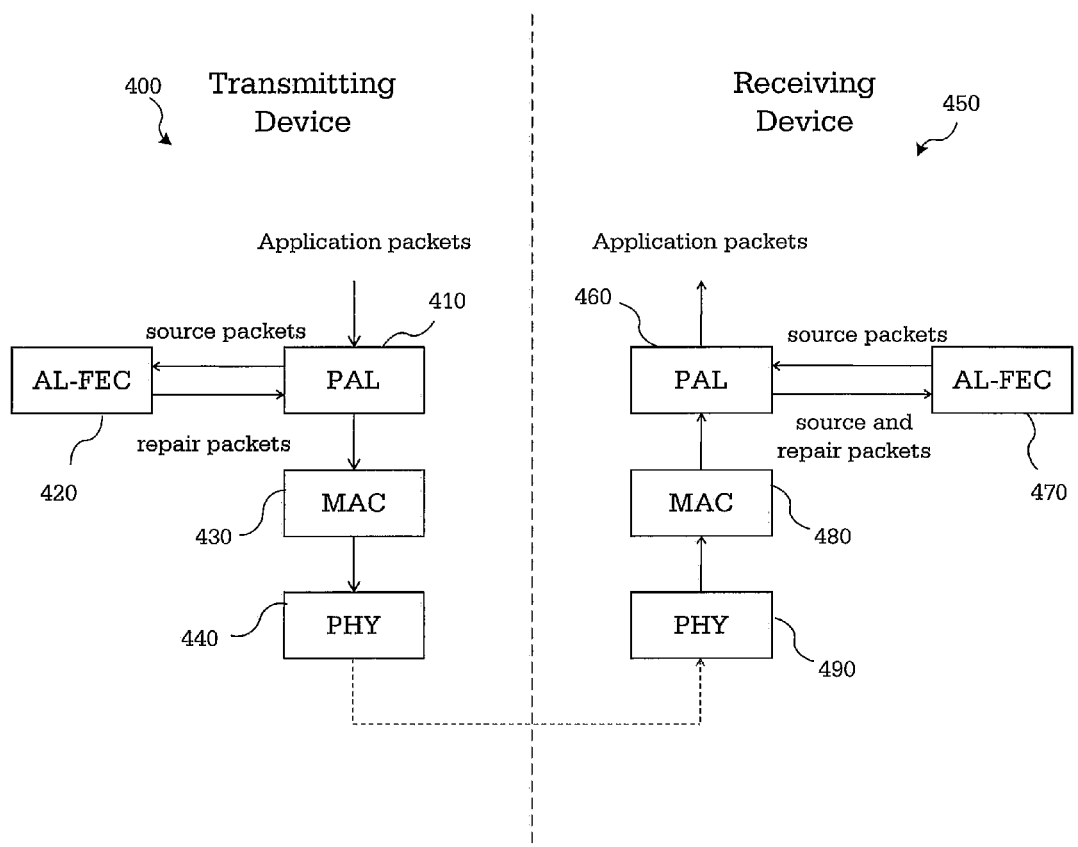
FIG. 4 illustrates an AL-FEC scheme according to an embodiment of the present disclosure.

FIG. 4 illustrates an AL-FEC scheme according to an embodiment of the present disclosure. The vertical hyphenated line separates the functional layers of a transmitting device 400 and a receiving device 450. The dotted line indicates data being transmitted from the transmitting device 400 to the receiving device 450. With respect to the AL-FEC framework, the transmitting device 400 includes a physical (PHY) layer 440, media access control (MAC) layer 430, a protocol adaptation layer (PAL) 410, and the AL-FEC component 420. Similarly, the receiving device 450 includes a PHY layer 490, a MAC layer 480, a PAL 460, and an AL-FEC component 470. Each of the transmitting device 400 and the receiving device 450 may be one of the may be any wireless communication device, such as the WiGig enabled devices 102-110.

The general operation of the transmitting device 400 in the AL-FEC scheme, according to an embodiment of the present disclosure, is as follows. In the transmitting device 400, a set of source packets to be protected together is specified. The source packets are reshaped to form a set of equal-sized source symbols. An AL-FEC code is applied on the source symbols to produce a set of repair symbols. After the repair symbols are encapsulated into repair packets, the transmitting device 400 sends the source packets and the repair packets to the receiving device 450.

The general operation of the receiving device 450 in the AL-FEC scheme, according to an embodiment of the present disclosure, is as follows. If all source packets are received successfully by the receiving device 450, then the received source packets are handled without AL-FEC recovery, and the received repair packets are discarded. In contrast, if there are missing source packets, the AL-FEC scheme will be applied to the successfully received source and repair packets to recover the missing source packets.

The protocol adaptation layer (PAL) 410 at the transmitting device 400 receives source data (e.g. application packets) from an upper layer (not illustrated), prepares packets to be transmitted, and sends the packets to the MAC layer 430. To this end, the PAL 410 may first specify the set of source packets (called source block) to be protected by selecting a suitable source block size (k symbols) and a suitable symbol size (T bytes), such that:

a) The PAL 460 at the receiving device 450 is capable of buffering T×m bytes (where m is the number of symbols that the receiver decodes per block).

b) For low overhead, k is chosen to be as large as possible from a predetermined interval such as [500, 8192]. If only a small number of options for k is required, then k is chosen from a predetermined set (e.g. from among 512, 1024, 2048, 4096, and 8192). If only one option for k is allowed, then set k to a default value (e.g. 1024).

c) Latency constraints put an upper bound on k. Note that the latency increases as k increases.

The set of source packets should have T×k bytes of payload.

PAL 410 generates a source block number (SBN) and sends the source block, SNB, k, and T to the AL-FEC component 420. PAL 410 also constructs the source packets by appending the header information to the source packet payload and sends the source packets and repair symbols received from the AL-FEC 420 to the MAC layer 430. The functions of the PAL 410 and the MAC layer 430 may be performed by a processor or controller of a wireless communication device.

At the receiving device 450, the PAL 460 receives packets (source packets and repair packets) from the MAC layer, recovers the source data, and sends the source data to an upper functional layer (not illustrated). To that end, PAL 460 determines whether all source packets are received successfully. If all source packets have been received successfully received, the source packets are handled without AL-FEC recovery, and the repair packets are discarded. In contrast, if there are missing packets, PAL 460 sends the successfully received source and repair packets to the AL-FEC component (470). PAL 460 gets the recovered source packets from the AL-FEC component 470.

In an embodiment, all functions of the PALs 410 and 460 described in the present disclosure may be performed in another layer that is above the MAC layers 430 and 480, respectively. PALs 410 and 460 support specific standards, such as data and display standards, that may be defined for WiGig. For example, PALs 410 and 460 may define support for HDMI (High-Definition Multimedia Interface) and DisplayPort. In another example, PALs 410 and 460 may be for input/output (I/O) data and support USB (Universal Serial Bus) and PCIe (Peripheral Component Interconnect Express).

The AL-FEC component 420 at the transmitting device 400 applies AL-FEC code on the source data to generate repair symbols, and encapsulates the repair symbols into repair packets. In an alternative embodiment, the repair symbols may be encapsulated into repair packets by the PAL 410. In the receiving device 450, the AL-FEC component 470 decodes the source and repair packets received from the PAL using the AL-FEC scheme to recover missing packets. In some embodiments, the AL-FEC components 420 and 470 or the functions of the AL-FEC components 420 and 470 may be integrated into the PALs 410 and 460, respectively. Also, in some embodiments, each of the PALs 410 and 460, AL-FEC components 420 and 470, MAC layers 430 and 480, and PHY layers 440 and 490 of the transmitting device 400 and the receiving device 450, respectively, may be configured to perform functions related to both transmission and reception.

The PHY layers 440 and 490 refer to the hardware communication functions. That is, the PHY layers 440 and 490 define the means of transmitting and receiving raw bits of data. In an embodiment, an FEC scheme is performed by the PHY layer 440 of the transmitting device 400 and the PHY layer 460 of the receiving device 450 during transmission. The FEC at the PHY layer may be a low-density parity-check (LDPC) code FEC scheme. The MAC layers 430 and 480 perform addressing and channel access control functions that are well-known in the art.

The following example describes raptor code parameters and for Gigabit wireless communications. Raptor code parameters may include a source block size of k='1024' symbols and symbol length T='48' bytes. As such, the buffer requirement for receiving the source block is approximately '49' KB. The packet loss rate after AL-FEC may be computed using Equation 2 below:

Packet loss rate after AL-FEC=(Packet loss rate before AL-FEC)×(Block-recovery failure rate)   [Eqn. 2]

With an overhead of '12' symbols at a block-recovery failure rate of $10^{-3}$, and a packet loss rate before AL-FEC of $10^{-3}$, the Packet loss rate after AL-FEC calculates to $10^{-5}$. In the case of failure, correctly received systematic symbols may still be used.

Other AL-FEC coding techniques that may be used to reduce packet erasure rate, according to some embodiments, include single parity check (SPC), convolutional coding, and Hamming code. These methods may take use a-priori knowledge of which packets are erased to detect and further correct packets, or at least not further deteriorate the performance. In addition, using a partially corrected packet (some of the bits corrected but not all—identified as an erased packet) with the above method may further help in correcting the remaining bits within the partially corrected packet and pass the CRC (cyclic redundancy check) or other correctness check.

In a single parity check technique, an additional parity packet (i.e. repair packet) is added to a set of k packets, thereby creating n=k+'1' packets overall. The added packet may be a parity check of all the k packets. That is, a parity packet is generated by performing a bit-wise XOR on the k packets. The set of k packets may be selected according to the original sequence or in some other manner, depending on the embodiment. This method guarantees corrections of a single packet erasure within n packets. In an embodiment, other combinations of higher order of added packets may be used to correct more erased packets within n packets by using the a-priori knowledge of which packet is erased. The process can be halted or not started when more than one packet is detected as erased (or missing) within the n packets, and notification for the erased packets will be sent to an upper layer in the hierarchy for possible retransmission. Using the SPC, the bit rate may be increased. Furthermore, using different coding rates in simple SPC can easily restore the required performance.

In some embodiments, the single parity check scheme may be non-interleaved or interleaved. FIG. 5A illustrates an example of a non-interleaved single parity check scheme according to an embodiment of the present invention. In this example, there are k='24' source packets. The added packet (packet 0) may be a parity check of all the k data packets (packets 1 . . . 24). In an embodiment, the packet 0 may be generated by performing a bit-wise XOR on the '24' source packets in the PAL or another layer above the MAC layer. This method guarantees corrections of a single packet erasure within n=k+'1'='25' packets.

In the non-interleaved FEC, A/V PAL generates a parity packet header with sequence number i ('0' in FIG. 5A) to protect the packets with sequence numbers i+1, . . . , i+24 (e.g. '1', '24'). The parity packet Length field is set to the length of the largest packet (including the header) among packets i+1, . . . , i+24. The FEC encoder computes the payload for the parity packet by bit-wise XOR the packets i+1 to i+24, where shorter packets is assumed to be padded by virtual (not transmitted) zero-bits.

In an embodiment a packet interleaver may be added to increase performance. Due to fading channel characteristics, erased packets may be in consecutive order which can significantly degrade the SPC. Adding a packet interleaver may significantly help the SPC to restore back performance by spreading the erased packets. FIG. 5B illustrates an example of an interleaved single parity check scheme according to an embodiment of the present invention.

In the illustrated example, a rectangular interleaver is used while concatenating four sets of packets such that, for each set of packets, n='25' and k='24' (one SPC) packet. That is, unlike the non-interleaved SPC scheme which transmits a single block that includes k data packets and one parity packet, the interleaved SPC scheme transmits four blocks of k data packets and four parity packets.

In the interleaved FEC, A/V PAL generates four parity packet headers with sequence numbers i, i+1, i+2, and i+3 ('0', '1', '2', and '3' in FIG. 5B) to protect the packets with sequence numbers i+4, ..., i+99. The FEC encoder computes the payloads of the parity packets as follows: the payload of the parity packet i is the bit-wise XOR of the packets i+4, i+8, i+12, ..., i+96, the payload of the packet i+1 is the bit-wise XOR of the packets i+5, i+9, i+13, ..., i+97, the payload of the parity packet i+2 is the bit-wise XOR of the packets i+6, i+10, i+14, ..., i+98, and, the payload of the parity packet i+3 is the bit-wise XOR of the packets i+7, i+11, i+15, ..., i+99.

Unlike the non-interleaved SPC scheme which cannot recover more than one packet per block, the interleaved SPC scheme may restore two to four consecutive erased packets. The order of the parity packets and systematic packets can be changed. For example, the systematic packets (e.g. data packets) may be sent prior to the parity packets.

Figure 6:
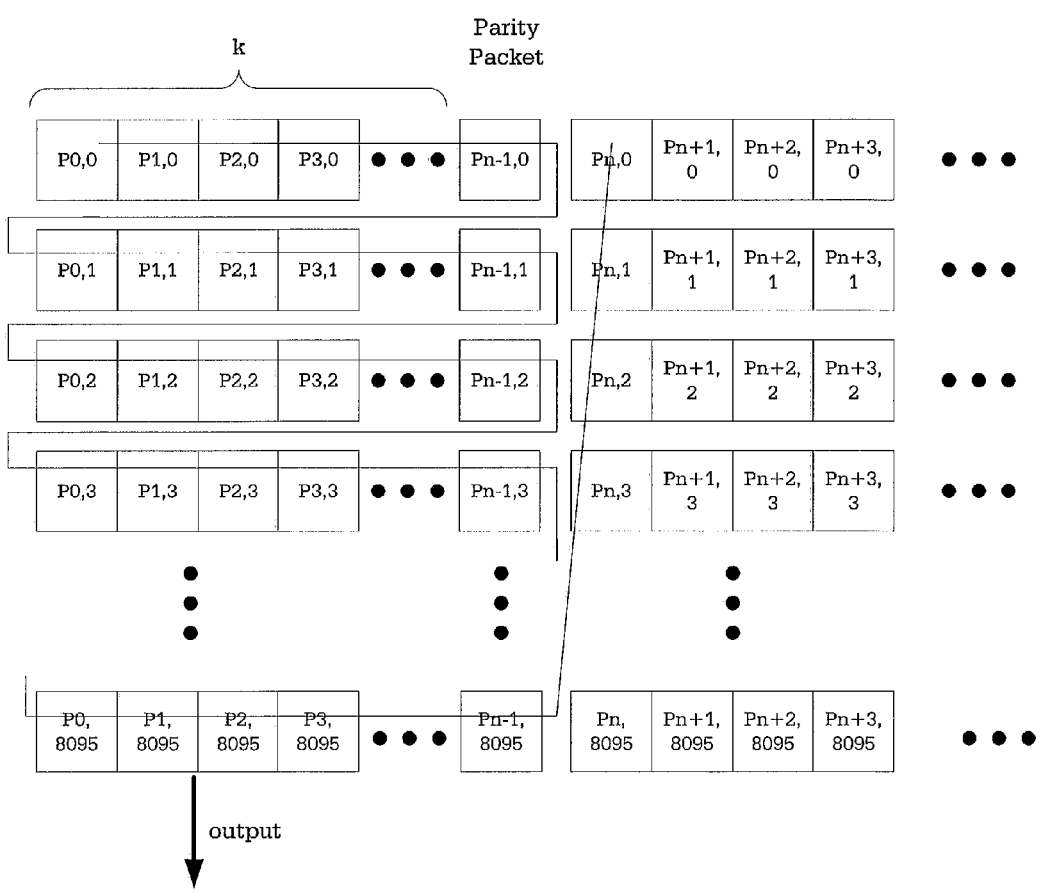
FIG. 6 illustrates a convolutional code for repairing erased packets according to an embodiment of the present disclosure.

FIG. 6 illustrates a convolutional code for repairing erased packets according to an embodiment of the present disclosure.

Convolutional code (CC) is based on XOR-ing of neighboring bits. High constraint length (CL) of convolutional code can get good repair performance. The higher the CL the higher the decoding complexity (Viterbi/Turbo decoding). The drawback in convolutional code is that if there is erased packet, all the bits in the packet are unknown. For consecutive erased bits (more than the CL) from the same packet, Viterbi decoding will not be able to repair the packet. This means that the packets need to be interleaved before encoded or before transmitted. The interleaver length can be in the size of the Traceback (i.e. 5*CL) or at least greater than the CL. When the erased bits are interleaved, the chances that they can be recovered increase. FIG. 6 shows an example of packets that are encoded in the AL-FEC according to an interleaved convolutional code with interleaver size of n='40' packets of '1000' bytes and CL='7' and CC coding rate of '39/40' (n−1/n) such that there are '39' systematic packets (e.g. contain data) and one parity packet (CC can support any code rate to increase repair performance).

The Px,y notation indicates the bit packet and bit position. For example, "P0,1" indicates packet '0' and bit position 0; and "P1,0" indicates packet '1' and bit position '0'. As such, the bits of each data and parity packet are illustrated vertically in FIG. 6 as the convolutional code works its way across the same bit position across n−1 packets in the block to calculate the corresponding parity bit in the parity packet. For example, to calculate bit '0' of the parity packet n−1 (i.e. "Pn−1,0"), the convolutional code works its way across "P0,0", "P1,0", "P2,0" ..., "Pn−2,0". Next, bit '1' of the parity packet ("Pn−1,1") is calculated, and so forth, until the last bit on the parity packet is calculated. If the data packets have different lengths, the parity packet has the length of the largest packet, and the shorter packets are padded with virtual zeroes at their respective tails for the purpose of executing the convolutional code. As with SPC, the order of the parity packet and the systematic packets may be changed.

Also in this case, a-priori knowledge of erased packets may determine whether the CC AL-FEC should be used (for example in very Low SNR where the packet erasure rate is high the repair chances decrease as SNR decreases). Consequently, the erasure rate of the transmission prior to the AL-FEC decoding does not worsen due to the a-priori knowledge of erased packets.

In another embodiment, a Hamming coding is used for AL-FEC. Using Hamming Code (HC), the level of repaired packets (number of erased bits or packets that may be recovered) is derived from the minimum. Hamming distance (dmin) of the Hamming coding. For example, for an H Matrix that has dmin='3', the number of repaired packets can be dmin−'1'='2' erased packets. When using a Hamming Code, there may be more than one parity packet for each set of packets (by adjusting the coding rate). The H matrix determines the dmin and coding rate. The maximum number of data packets in each set of packets is determined based on the number of Hamming Code parity packets, such that for m parity bits (or packets), up to $2^m - m - 1$ data bits (or packets) may be encoded. For example, the Hamming (7,4) code, which encodes every four data bits into seven bits, adds three parity bits.

In some embodiments, an interleaved or uninterleaved single parity check may be combined with the Hamming Code. For example, a single parity check encoding (interleaved or non-interleaved) may be performed on the Hamming encoded packets to form an extra parity packet.

The upper embodiments describe a more simple way to implement AL-FEC than raptor codes. This makes any of the described AL-FEC schemes suitable to be used in a low power device that can benefit from AL-FEC to repair its erased packets.

FIG. 7 illustrates a description of a header of a packet that has been encoded using an AL-FEC scheme according to an embodiment of the present disclosure. In some embodiments the packet header 700 may be generated and appended at the particular functional layer at which the AL-FEC scheme is performed. For example, in an embodiment in which the AL-FEC scheme is performed in the PAL, the packet header 700 may be generated and appended to the outgoing packets from the PAL.

Each column in packet header 700 corresponds to at least one field. The text in each block of the upper row describes the information included in the packet header field, and the numbers in the lower row indicate the octet length (number of bytes) of the respective header fields. The PacketType header field, which has a length of one octet (8 bits), indicates whether the packet is systematic (e.g. contains data) or parity.

In an embodiment, a single bit (e.g. the first bit) may be allocated in the PacketType field to distinguish a parity packet from a systematic (e.g. data) packet. When using a single bit to indicate a parity packet, a '0' may be used to indicate that the packet is systematic (data), and a '1' may be used to indicate that the packet is parity (or vice versa). For example, a PacketType header field with a value of "1xxxxxxx" may indicate a parity packet while "0xxxxxxx" may indicate a systematic packet. In an embodiment, a single bit may be allocated in any other packet header field.

In another embodiment, a specific 8-bit value in the PacketType field may be defined in the WiGig specifications to indicate a parity packet. For example, a value of '0x80' (or "10000000") may indicate a parity packet. Alternatively, a specific value may be used in another header field to distinguish a parity packet from systematic packets.

The stream identifier (ID) identifies the data stream to which the packet belongs. In an embodiment, the stream ID may refer to a block of transmission. The sequence number (SeqNum) may identify the sequential order of the packet within the block. The length field may indicate the size of the payload or the total number of packets in the block, depending on the embodiment.

There may be circumstances under which a transmitting or receiving device does not have AL-FEC capabilities. As such, devices may exchange AL-FEC capability information during the capabilities exchange period prior to transmitting payloads, according to an embodiment of the present disclosure.

Figure 8:
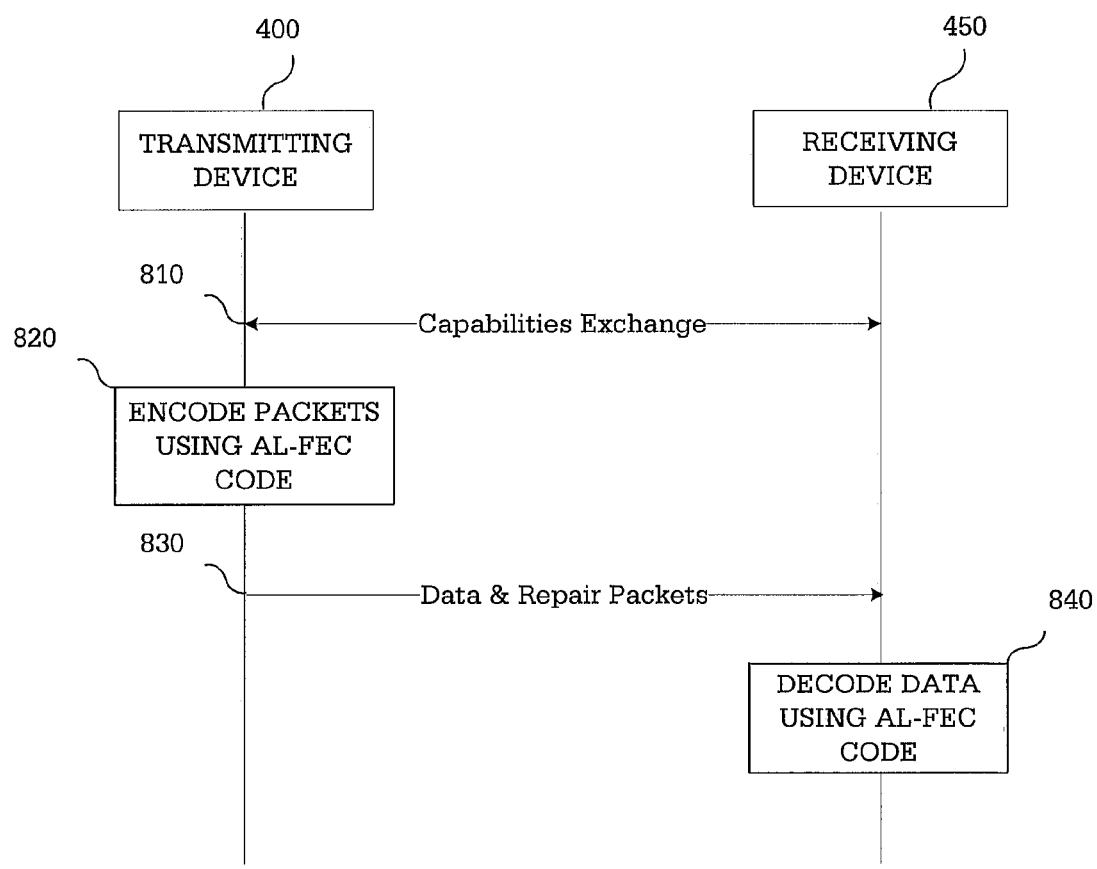
FIG. 8 illustrates a general process for using AL-FEC in a wireless communication system, according to an embodiment of the present disclosure.

FIG. 8 illustrates a general process for using AL-FEC in a wireless communication system, according to an embodiment of the present disclosure. Prior to data communication, the transmitting device 400 and the receiving device 450 exchange capabilities information 810. In some embodiments, the capabilities exchange information 810 includes the AL-FEC capability information. After completing the capabilities exchange process, the transmitting device 400 encodes packets for transmission using AL-FEC code in block 820. This process will be described further with reference to FIG. 9. In some embodiments, the transmitting device 400 may also perform an additional FEC coding in the PHY layer after the AL-FEC encoding. The transmitting device 400 then transmits the encoded systematic (e.g. data) packets and repair packets 830 to the receiving device 450. In block 840, the receiving device 450 may recover missing packets (or packets with error) using the AL-FEC code. In some embodiments, the receiving device may first determine whether packet recovery using the AL-FEC decoding process should be performed. This process will be described further with reference to FIG. 10. In some embodiments the receiving device 450 may perform FEC decoding in the PHY layer prior to sending up the received packets for AL-FEC decoding.

Figure 9:
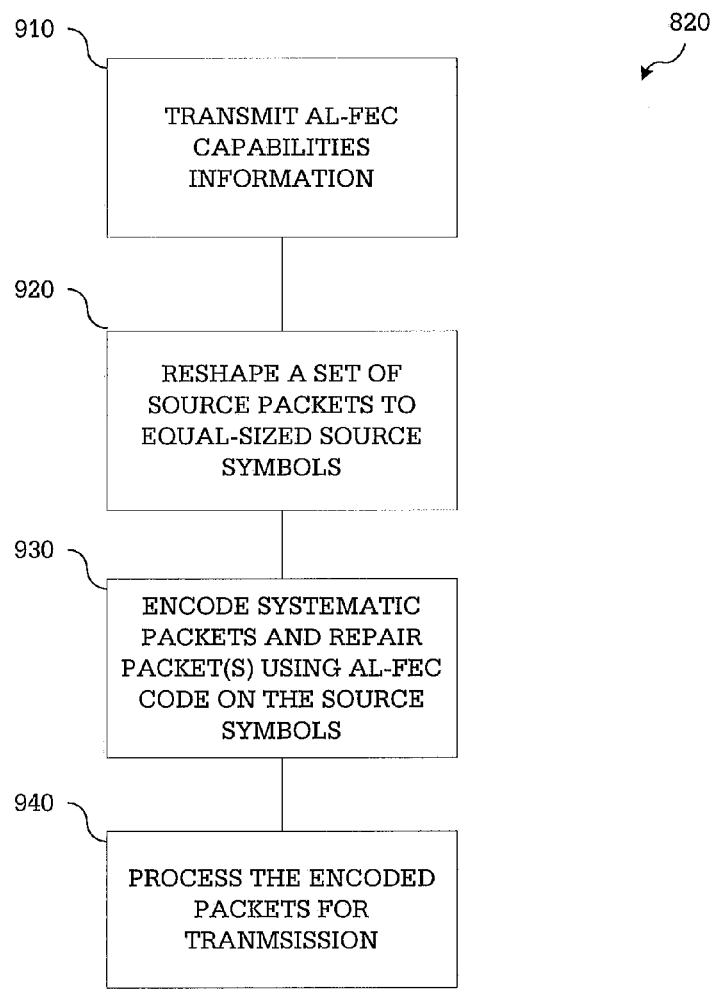
FIG. 9 illustrates a process for encoding packets for transmission using an AL-FEC code according to an embodiment of the present disclosure.

FIG. 9 illustrates a process for encoding packets for transmission using an AL-FEC code according to an embodiment of the present disclosure. In block 910, a transmitting device (e.g. transmitting device 400) transmits AL-FEC capabilities information to at least one receiving device (e.g. receiving device 450).

In block 920, the transmitting device reshapes a set of source packets to equal-sized source symbols. In an embodiment, the source packets (called a source block) that are specified to be protected together are selected based on a selected source block size. The selected source block size may be based on a k number of symbols and a T number of bytes per symbol such that the PAL (or functional layer responsible of performing AL-FEC decoding) in the receiving device is capable of buffering at least T×k bytes.

In block 930, the transmitting device generates systematic packets and at least one repair packet (based on AL-FEC coding scheme) by using an AL-FEC code on the source symbols. In an embodiment, the PAL assigns a source block number (SBN) to the source block (the set of source packets to be protected together) and sends the source block, SBN, T, and k to the AL-FEC encoder. The AL-FEC encoder (which may be implemented as hardware or software) applies the AL-FEC code to the source symbols to produce a set of repair symbols.

The repair symbols are encapsulated into one or more repair packets, depending on which of the above-described AL-FEC coding schemes is used. For example, when the non-interleaved SPC coding scheme is used, one repair (e.g. parity) packet is generated per source block. That is, assuming n='25' and k='24', the PAL generates a parity packet header with sequence number i and sends the packets i+1, . . . , i+24 to the FEC encoder. The FEC encoder generates the payload of the parity packet by bit-wise XOR of packets i+1, . . . , i+24. When the four-interleaved SPC coding scheme is used, one repair packet is generated for each of the four sets of data packets when the interleaved SPC coding scheme is used. That is, assuming n='25' and k='24', for each set, the PAL generates four parity packet headers with sequence numbers i, i+1, i+2, and i+3, and sends the packets i+4, . . . , i+99 to the FEC encoder. The FEC encoder generates the parity packet payload by bit-wise XOR packets i+4, i+8, . . . , i+96. The FEC encoder computes the payloads of the parity packets as follows: the payload of the parity packet i is the bit-wise XOR of the packets i+4, i+8, i+12, . . . , i+96, the payload of the packet i+1 is the bit-wise XOR of the packets i+5, i+9, i+13, . . . , i+97, the payload of the parity packet i+2 is the bit-wise XOR of the packets i+6, i+10, i+14, . . . , i+98, and, the payload of the parity packet i+3 is the bit-wise XOR of the packets i+7, i+11, i+15, . . . , i+99. In an embodiment, the AL-FEC scheme may be used and changed on a block-by-block basis.

The one or more source symbols in the source block are included in systematic packets. In an embodiment, each systematic packet corresponds to one source symbol. The length of the repair packets is equal to the length of the longest systematic packet from among the packets for which the repair packet was generated. The PAL generates a packet header (which includes the indicator for systematic/parity packets, stream ID, sequence number, and such) for each of the systematic/repair packets, appends the packet headers to the corresponding systematic/repair packets, and sends the source packets to the MAC layer.

In an embodiment, block 930 is performed in the PAL and an AL-FEC encoder. As already discussed, the PAL and AL-FEC encoder may separate components or integrated into the PAL. In another embodiment, block 930 may be performed in another upper functional layer that is above the MAC layer.

In block 940, the encoded systematic/repair packets in the block are subsequently processed in the MAC and PHY layers for transmission. In an embodiment, the PHY layer applies an FEC coding scheme to the AL-FEC encoded packets prior to transmission in order to achieve the required performance.

Figure 10:
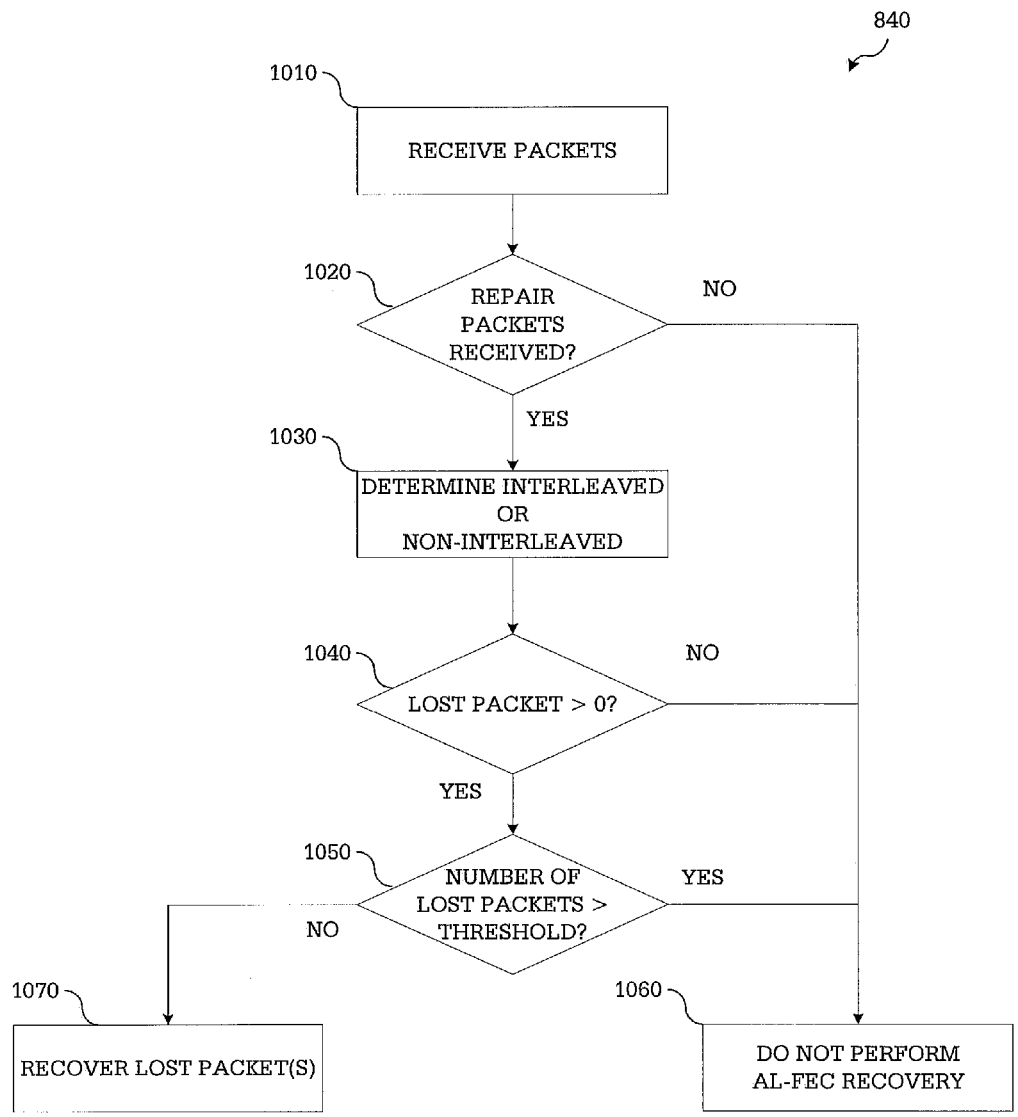
FIG. 10 illustrates a process for decoding packets using an AL-FEC code according to an embodiment of the present disclosure.

FIG. 10 illustrates a process for decoding packets using an AL-FEC code according to an embodiment of the present disclosure. Process 840 represents an embodiment in which the system can operate in one of three options: 1) AL-FEC turned off such that there are no repair packets; 2) Non-interleaved (25,24)-SPC AL-FEC, in which each block includes twenty-five packets (twenty-four systematic packets and one repair packet); and 3) Four interleaved (25,24)-SPC AL-FEC, in which each block includes four sets of twenty-five packets (twenty-four systematic packets and one repair packet per set).

In block 1010, the receiving device (e.g. receiving device 450) receives a packets for a block of transmission from the transmitting device (e.g. transmitting device 400). In block 1020, the receiving device determines whether repair packets have been received. That is, the PAL (or functional layer responsible of performing AL-FEC decoding) in the receiving device checks the header of each packet to detect the AL-FEC indicator (e.g. PacketType field discussed with regard to FIG. 7).

If no repair packets have been received, the process proceeds to block 1060 and does not perform AL-FEC recovery. This may occur if the packets were transmitted with AL-FEC turned off. As such, the PAL may determine that all of the packets in the load were received, with none of the received packets indicated as repair packets. If data packets are missing with AL-FEC turned off, the receiving device may request retransmission of the missing packets or the entire block. In an embodiment, if only the repair (e.g. parity) packet(s) are missing, the receiving device may request a retransmission of the missing repair packets.

If repair packets have been received, the receiving device, in block 1030, determines whether the packets are interleaved. For example, assuming that the repair packets are sequenced first, if only the first packet of the load (with SeqNum i) is a repair packet, the receiving device can determine that the packets are not interleaved. That is because the first packet in the block should be the repair packet, indicated by the AL-FEC bit (e.g. parity packet indicator) in the packet header. Once receiving packet i+1 (or packet i+2 or i+3 in case i+1 is lost), if the parity packet indicator is set to zero, then the packets i, i+1, . . . , i+24 forms an AL-FEC block. If one of the source packets i+1, . . . , i+24 is lost, it can be recovered by bit-wise XOR-ing the other packets in the AL-FEC block.

Continuing with the example, if at least two of the first four packets (SeqNum i, i+1, i+2, and i+3) received indicate that the AL-FEC is ON (e.g. parity packet indicator is set to '1'), the receiving device can determine that the packets were transmitted using the interleaved SPC AL-FEC coding scheme. That is, packets i, i+4, i+8, . . . , i+96 form an AL-FEC set (e.g. block), packets i+1, i+5, i+9, . . . , i+97 form a set, packets i+2, i+6, i+10, . . . , i+98 form a set, and packets i+3, i+7, i+11, . . . , i+99 form a set.

In all the above cases and modes, whether the erased (parity/systematic) packets can be repaired or not, it is guaranteed that using the knowledge of the StreamID and/or SeqNum the PAL of the receiving device will always be able to decide how to repair the packets.

In block 1040, the receiving device determines whether any packets were lost. If none of the packets are missing (i.e. all source packets are received successfully), then the source packets are handled without AL-FEC recovery, and the repair packets are discarded. The process proceeds to block 1060.

In contrast, if there are missing source packets, the receiving device, in block 1050, determines whether the number of lost packets is greater than a threshold, based on the type of AL-FEC coding scheme. As discussed with respect to FIGS. 5A and 5B, only one missing packet may be recovered under non-interleaved SPC scheme, and up to four consecutive missing packets or one missing packet per set may be recovered under the four interleaved SPC scheme.

As such, if the PAL determined in block 1030 that the packets are not interleaved, then the threshold is one missing packet. Alternatively, if the PAL determined in block 1030 that the packets are interleaved, then the threshold is four consecutive missing packets or one missing packet per set.

If the number of lost packets is greater than the corresponding threshold, the process proceeds to block 1060 and does not perform AL-FEC recovery. In an embodiment, the receiving device may request the retransmission of the missing packets or the entire block.

In contrast, if the number of lost packets is not greater than the corresponding threshold, the receiving device, in block 1070, proceeds to perform AL-FEC decoding to recover the lost packet(s). That is, the PAL sends the block to the FEC decoder to recover the lost packet(s).

The process illustrated in FIG. 10 is for illustrative purposes only and is not meant to limit the scope of the present disclosure. In other embodiments, the sequence of the blocks may be rearranged without departing from the scope of the disclosure. For example, block 1040 for determining whether any packets are missing may be performed immediately after the packets are received from the MAC layer in block 1010. Block 1020 may then be performed after determining that at least one packet is missing.

It is noted that the length of each AL-FEC packet in the AL-FEC block is equal to that of the packet which has the maximum length. This allows the PAL packets in the same block to have different lengths. For example, when the PAL packet length is smaller than the AL-FEC packet length, then the AL-FEC encoder/decoder may compensate the difference by padding "virtual" zeros (The virtual zeros need not to be sent once identified by both encoder and decoder).

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method of performing forward error correction (FEC) in a wireless communication device in a wireless communication network, the method comprising:
   transmitting application layer forward error correction (AL-FEC) capability information during a capabilities exchange;
   applying a single parity check (SPC) AL-FEC code on a set of k source packets to encode i) systematic packets for the set of k source packets and ii) at least one parity packet, a header of each of the encoded systematic packets and at least one parity packet comprising a parity packet indicator, wherein applying the SPC AL-FEC code to encode the at least one parity packet comprises computing a payload for the at least one parity packet by performing a bit-wise XOR on one of the set of k source packets; and
   processing the encoded systematic packets and the at least one parity packet in a media access control (MAC) layer and a physical (PHY) layer for transmission;
   wherein the SPC AL-FEC code comprises a non-interleaved mode, wherein encoding the systematic packets and the at least one parity packet comprises:
   generating a sequence number i for one parity packet;
   generating sequence numbers i+1, i+2, . . . , i+k for the set of k source packets; and
   wherein computing the payload for the at least one parity packet comprises performing the bit-wise XOR on the set of k source packets to compute the payload for the parity packet with the sequence number i,
   wherein the sequence number for the parity packet is included in a header for the parity packet, and the sequence numbers for the set of k source packets are included in headers for corresponding systematic packets.

2. The method of claim 1, wherein encoding the systematic packets for the set of k source packets and the at least one parity packet comprises performing a Hamming AL-FEC code in combination with the SPC AL-FEC code.

3. The method of claim 1, further comprising:
   receiving a packet block comprising at least one of systematic packets and repair packets;
   determining whether at least one packet is missing in the received packet block;
   when at least packet is missing, determining whether the received packets are AL-FEC encoded by checking the parity packet indicator in each received packet;
   when the AL-FEC code is detected, determining whether the at least one missing packet may be recovered; and
   in response to determining that the at least one missing packets may be recovered, performing AL-FEC decoding by using the received systematic and repair packets.

4. The method of claim 3, wherein determining whether the received packets are AL-FEC encoded further comprises determining whether the received packets are interleaved based on a number of parity packets received.

5. A method of performing forward error correction (FEC) in a wireless communication device in a wireless communication network, the method comprising:
  transmitting application layer forward error correction (AL-FEC) capability information during a capabilities exchange;
  applying a single parity check (SPC) AL-FEC code on a set of k source packets to encode i) systematic packets for the set of k source packets and ii) at least one parity packet, a header of each of the encoded systematic packets and at least one parity packet comprising a parity packet indicator, wherein applying the SPC AL-FEC code to encode the at least one parity packet comprises computing a payload for the at least one parity packet by performing a bit-wise XOR on one of the set of k source packets; and
  processing the encoded systematic packets and the at least one parity packet in a media access control (MAC) layer and a physical (PHY) layer for transmission;
  wherein the SPC AL-FEC code comprises an interleaved mode with x subsets of source packets, wherein encoding the systematic packets and the at least one parity packet comprises:
  generating sequence numbers i, i+1, i+2, f i+(x−I) for x parity packets, each parity packet corresponding to one of x subsets of source packets;
  generating sequence numbers i+1, i+2, . . . , i+k for the set of k source packets;
  interleaving the set of k source packets across the x subsets such that source packets with consecutive sequence numbers correspond to different subsets; and
  wherein computing the payload for the at least one parity packet comprises computing a payload for each of the x parity packets by performing a bit-wise XOR on a corresponding subset of source packets,
  wherein the sequence numbers for the parity packets are included in headers for corresponding parity packets, and the sequence numbers for the set of k source packets are included in headers for corresponding systematic packets.

6. The method of claim 5, further comprising:
  receiving a packet block comprising at least one of systematic packets and repair packets;
  determining whether at least one packet is missing in the received packet block;
  when at least packet is missing, determining whether the received packets are AL-FEC encoded by checking the parity packet indicator in each received packet;
  when the AL-FEC code is detected, determining whether the at least one missing packet may be recovered; and
  in response to determining that the at least one missing packets may be recovered, performing AL-FEC decoding by using the received systematic and repair packets.

7. The method of claim 6, wherein determining whether the received packets are AL-FEC encoded further comprises determining whether the received packets are interleaved based on a number of parity packets received.

8. An apparatus for performing forward error correction (FEC) in a wireless communication device in a wireless communication network, the apparatus comprising:
  a transmitter configured to communicate with other communication devices; and
  a controller coupled to the transmitter and configured to:
    control the transmitter to transmit application layer forward error correction (AL-FEC) capability information during a capabilities exchange;
    apply a single parity check (SPC) AL-FEC code on a set of k source packets to encode i) systematic packets for the set of k source packets and ii) at least one parity packet, a header of each of the encoded systematic packets and the at least one parity packet comprising a parity packet indicator, wherein to apply the SPC AL-FEC code to encode the at least one parity packet the controller is configured to compute a payload for the at least one parity packet by performing a bit-wise XOR on one of the set of k source packets or a subset of source packets in the set of k source packets; and
  process the encoded systematic packets and the at least one parity packet in a media access control (MAC) layer and a physical (PHY) layer for transmission;
  wherein the SPC AL-FEC code comprises an non-interleaved mode, wherein the controller is further configured to:
  generate a sequence number i for one parity packet;
  generate sequence numbers i+1, i+2, . . . , i+k for the set of k source packets; and
  wherein in computing the payload for the at least one parity packet the controller is further configured to perform the bit-wise XOR on the set of k source packets to compute the payload for the parity packet with the sequence number i,
  wherein the sequence number for the parity packet is included in a header for the parity packet, and the sequence numbers for the set of k source packets are included in headers for corresponding systematic packets.

9. The apparatus of claim 8, wherein the controller is further configured to perform a Hamming AL-FEC code in combination with the SPC AL-FEC code when encoding the systematic packets for the set of k source packets and the at least one parity packet.

10. The apparatus of claim 8, wherein the controller is further configured to:
  receive at least one of systematic packets and repair packets;
  determine whether at least one packet is missing;
  when any packet is missing, determine whether the received packets are AL-FEC encoded by checking the parity packet indicator in each received packet;
  when the AL-FEC code is detected, determine whether the at least one missing packet may be recovered; and
  in response to determining that the missing packets may be recovered, perform AL-FEC decoding by using the received systematic and repair packets.

11. The apparatus of claim 10, wherein the controller is further configured to determine whether the received packets are interleaved based on a number of parity packets received when determining whether the received packets are AL-FEC encoded.

12. An apparatus for performing forward error correction (FEC) in a wireless communication device in a wireless communication network, the apparatus comprising:
  a transmitter configured to communicate with other communication devices; and
  a controller coupled to the transmitter and configured to:
    control the transmitter to transmit application layer forward error correction (AL-FEC) capability information during a capabilities exchange;
    apply a single parity check (SPC) AL-FEC code on a set of k source packets to encode i) systematic packets for the set of k source packets and ii) at least one parity packet, a header of each of the encoded systematic packets and the at least one parity packet comprising a parity packet indicator, wherein to apply the SPC AL-FEC code to encode the at least one parity packet the controller is configured to compute a payload for the at least one parity packet by performing a bit-wise XOR on one of the set of k source packets or a subset of source packets in the set of k source packets; and process the encoded systematic packets and the at least one parity packet in a media access control (MAC) layer and a physical (PHY) layer for transmission;

wherein the SPC AL-FEC code comprises an interleaved mode with x subsets of source packets, wherein the controller is further configured to:

generate sequence numbers i, i+1, i+2, ..., i+(x−I) for x parity packets, each parity packet corresponding to one of x subsets of source packets;

generate sequence numbers i+1, i+2, ..., i+k for the set of k source packets;

interleave the set of k source packets across the x subsets such that source packets with consecutive sequence numbers correspond to different subsets; and wherein in computing the payload for the at least one parity packet the controller is further configured to compute a payload for each of the x parity packets by performing a bit-wise XOR on a corresponding subset of source packets, wherein the sequence numbers for the parity packets are included in headers for corresponding parity packets, and the sequence numbers for the set of k source packets are included in headers for corresponding systematic packets.

13. The apparatus of claim 12, wherein the controller is further configured to:

receive at least one of systematic packets and repair packets;

determine whether at least one packet is missing;

when any packet is missing, determine whether the received packets are AL-FEC encoded by checking the parity packet indicator in each received packet;

when the AL-FEC code is detected, determine whether the at least one missing packet may be recovered; and in response to determining that the missing packets may be recovered, perform AL-FEC decoding by using the received systematic and repair packets.

14. The apparatus of claim 13, wherein the controller is further configured to determine whether the received packets are interleaved based on a number of parity packets received when determining whether the received packets are AL-FEC encoded.

* * * * *